United States Patent
Choi et al.

(10) Patent No.: US 7,982,138 B2
(45) Date of Patent: Jul. 19, 2011

(54) METHOD OF NICKEL-GOLD PLATING AND PRINTED CIRCUIT BOARD

(75) Inventors: Jin-Hak Choi, Suwon-si (KR);
Seoung-Jae Lee, Suwon-si (KR);
Bae-Kyun Kim, Seongnam-si (KR);
Eun-Ju Yang, Suwon-si (KR);
Jong-Yun Kim, Suwon-si (KR);
Yeo-Joo Yoon, Suwon-si (KR)

(73) Assignees: Samsung Electro-Mechanics Co., Ltd., Gyunggi-Do (KR); Samsung LED Co., Ltd., Gyunggi-Do (KR)

( * ) Notice: Subject to any disclaimer, the term of this patent is extended or adjusted under 35 U.S.C. 154(b) by 238 days.

(21) Appl. No.: 12/369,143

(22) Filed: Feb. 11, 2009

(65) Prior Publication Data
US 2010/0059257 A1    Mar. 11, 2010

(30) Foreign Application Priority Data
Sep. 5, 2008    (KR) ........................ 10-2008-0087865

(51) Int. Cl.
*H05K 1/09* (2006.01)
*H05K 1/11* (2006.01)
*B32B 3/00* (2006.01)

(52) U.S. Cl. .......................... 174/257; 174/261; 428/209

(58) Field of Classification Search .................. 174/261, 174/257; 428/209
See application file for complete search history.

(56) References Cited

U.S. PATENT DOCUMENTS

| | | | | |
|---|---|---|---|---|
| 4,842,961 A * | 6/1989 | Basile et al. | ................ | 428/672 |
| 5,780,143 A * | 7/1998 | Shimamoto et al. | .......... | 428/209 |
| 7,078,796 B2 * | 7/2006 | Dunn et al. | ................... | 257/690 |
| 2005/0141836 A1 * | 6/2005 | Peret | ............................. | 385/128 |
| 2007/0104929 A1 * | 5/2007 | Yim et al. | ...................... | 428/209 |
| 2007/0243665 A1 * | 10/2007 | Abbott et al. | .................. | 438/123 |
| 2009/0218119 A1 * | 9/2009 | Nakai et al. | .................... | 174/257 |
| 2009/0218125 A1 * | 9/2009 | Nakai et al. | .................... | 174/263 |
| 2009/0286104 A1 * | 11/2009 | Tysoe et al. | .................... | 428/634 |

FOREIGN PATENT DOCUMENTS

| | | |
|---|---|---|
| JP | 06-310830 | 11/1994 |
| JP | 07-007243 | 1/1995 |
| JP | 07007243 A * | 1/1995 |
| KR | 10-0648970 | 11/2006 |
| KR | 10-0756261 | 9/2007 |

OTHER PUBLICATIONS

Machine Translation of JP 07007243 A: Okuda, Y., Electrolytic gold @ plating process for printed wiring.*
Japanese Office Action, with partial English translation, issued in Japanese Patent Application No. 2009-017933, mailed Jan. 4, 2011.
Korean Office Action, w/ partial English translation thereof, issued in Korean Patent Application No. KR 10-2008-0087865 dated May 19, 2010.

* cited by examiner

*Primary Examiner* — William H Mayo, III
*Assistant Examiner* — Sherman Ng
(74) *Attorney, Agent, or Firm* — McDermott Will & Emery LLP (57) ABSTRACT

Disclosed are a method of electroless nickel-gold plating an object and a printed circuit board. The method in accordance with an embodiment of the present invention includes: forming a first nickel plated layer on a surface of the object; forming a second nickel plated layer on the first nickel plated layer; and forming a gold plated layer on the second nickel plated layer.

9 Claims, 14 Drawing Sheets

METHOD OF NICKEL-GOLD PLATING AND PRINTED CIRCUIT BOARD

CROSS-REFERENCE TO RELATED APPLICATIONS

This application claims the benefit of Korean Patent Application No. 10-2008-0087865, filed with the Korean Intellectual Property Office on Sep. 5, 2008, the disclosure of which is incorporated herein by reference in its entirety.

BACKGROUND

1. Technical Field

The present invention relates to a method of nickel-gold plating and a printed circuit board.

2. Description of the Related Art

In a typical printed circuit board, a copper (Cu) circuit is formed on a copper clad laminate (CCL) and then a nickel layer and a gold plated layer are formed on the copper circuit before a final surface treatment. A nickel plated layer is used as a plating underlayer of the gold plated layer and performs a function of preventing interdiffusion between the copper and the gold plated layer. The gold plated layer intends to reduce an electrical resistance in the part of a substrate coming in contact with an electronic component and to improve bondability between the substrate and the electronic component. The gold plating process is performed in order of oil-removal, soft etching, catalyst, electroless nickel plating and an gold plating.

With regard to the electroless plating, which is one of the methods of treating the surface of the printed circuit board, the nickel plated layer is plated by the electroless method using a reducing agent on a copper plated layer having circuits formed thereon. Then, the gold plated layer is formed on the nickel plated layer by a method of substituting nickel with gold. Local corrosion occurs in a part of the plating underlayer due to a local cell effect generated during the process of the electroless plating. In case the local substitution is excessive in the plating underlayer, a pinhole or discoloration of a plated surface can be observed after forming the electroless plating. Since such an excessive corrosion of the plating underlayer causes the plating underlayer to be diffused into the electroless plated surface, a wire-bonding and a soldering effect, etc., are hereby deteriorated and the reliability of the printed circuit board is reduced.

SUMMARY

The present invention provides a method of nickel-gold plating that has a layered structure without causing a crack on a surface, and a printed circuit board plated by using the method.

An aspect of the present invention features a method of electroless nickel-gold plating an object. The method in accordance with an embodiment of the present invention can include: forming a first nickel plated layer on a surface of the object; forming a second nickel plated layer on the first nickel plated layer; and forming a gold plated layer on the second nickel plated layer.

The forming of the first nickel plated layer can include: adhering a catalyst to the object; and performing electroless nickel plating on the object. The forming of the second nickel plated layer can include: adhering a catalyst to the first nickel plated layer; and performing electroless nickel plating on the first nickel plated layer. The catalyst can include palladium (Pd).

The method can further include before the forming of the first nickel plated layer, forming roughness on the surface of the object.

Another aspect of the present invention features a printed circuit board. The printed circuit board in accordance with an embodiment of the present invention can include: a substrate; a circuit pattern formed on a surface of the substrate; a first nickel plated layer formed on the circuit pattern; a second nickel plated layer formed on the first nickel plated layer; and a gold plated layer formed on the second nickel plated layer. In this case, a thickness of the second nickel plated layer can be less than a thickness of the first nickel plated layer.

A first palladium layer can be interposed between the circuit pattern and the first nickel plated layer. A second palladium layer can be interposed between the first nickel plated layer and the second nickel plated layer.

DETAILED DESCRIPTION

Since there can be a variety of permutations and embodiments of the present invention, certain embodiments will be illustrated and described with reference to the accompanying drawings. This, however, is by no means to restrict the present invention to certain embodiments, and shall be construed as including all permutations, equivalents and substitutes covered by the spirit and scope of the present invention. In the following description of the present invention, the detailed description of known technologies incorporated herein will be omitted when it may make the subject matter unclear.

Terms such as "first" and "second" can be used in describing various elements, but the above elements shall not be restricted to the above terms. The above terms are used only to distinguish one element from the other.

The terms used in the description are intended to describe certain embodiments only, and shall by no means restrict the present invention. Unless clearly used otherwise, expressions in the singular number include a plural meaning. In the present description, an expression such as "comprising" or "consisting of" is intended to designate a characteristic, a number, a step, an operation, an element, a part or combinations thereof, and shall not be construed to preclude any presence or possibility of one or more other characteristics, numbers, steps, operations, elements, parts or combinations thereof.

Hereinafter, embodiments of a method of nickel-gold plating and a printed circuit board in accordance with the present invention will be described in detail with reference to the accompanying drawings. In description with reference to accompanying drawings, the same reference numerals will be assigned to the same or corresponding elements, and repetitive descriptions thereof will be omitted.

A printed circuit board (PCB) uses a circuit made of copper (Cu) and performs a function of connecting electrical signals between electronic components mounted on a substrate. The PCB is a substrate designed to mount a semiconductor and has an upper surface connecting an Au wire with the semiconductor and a lower surface to which a solder ball functioning as a lead is adhered. As the semiconductor has recently a higher speed and a finer circuit, the printed circuit board is rapidly and increasingly used as a package having a type for substituting an existing lead frame.

Figure 1:
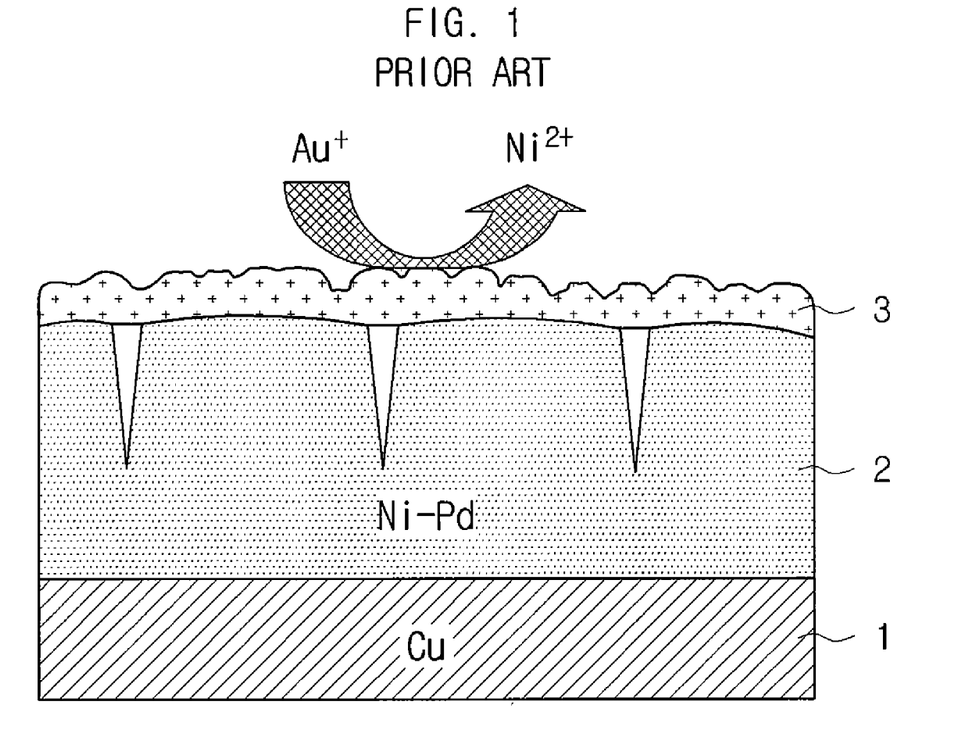
FIG. 1 is a view showing a process of forming a plating underlayer and a gold plated layer in accordance with a conventional method of nickel-gold plating.

With an electroless plating method among methods of treating the surface of the PCB, plating is performed through substitution reaction of a component to be plated among the plated underlayer and electroless plating solution. FIG. 1 is a view showing a process of forming a plating underlayer and a gold plated layer in accordance with a conventional electroless plating method. A nickel plated layer 2 is plated by an electroless method using a reducing agent on a copper plated layer 1 on which a circuit is formed. Then, a gold plated layer 3 is plated on the nickel plated layer 2 through a method of substituting nickel with gold.

If local substitution in the nickel plated layer 2, i.e., a plating underlayer is excessively performed during the process of electroless gold plating, the local substitution may be a cause of a pinhole or discoloration of a plated surface, etc., after forming the gold plated layer 3. The local excessive substitution in the plating underlayer can be described with an electrochemical local cell effect. The plating underlayer having ionization tendency higher than that of an electroless plating component functions as an anode and can be easily oxidized into the ion state of M2+, which can be described with typical Galvanic corrosion model.

Figure 2:
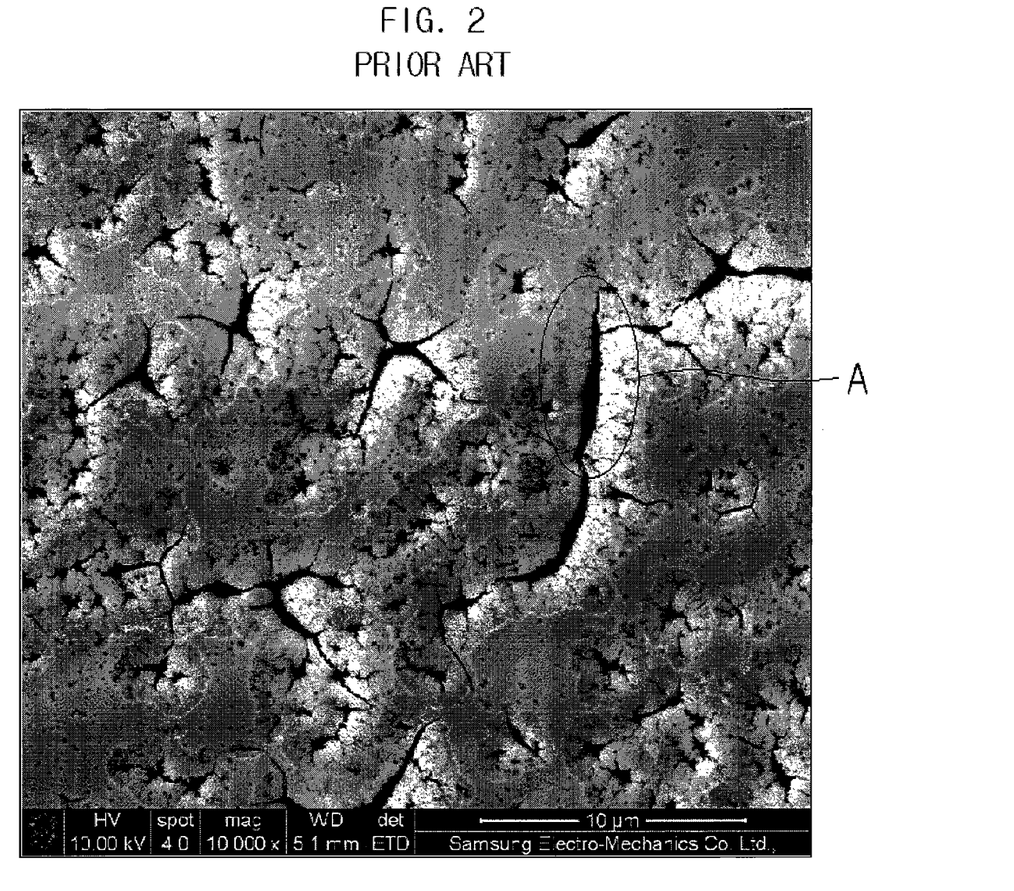
FIG. 2 is an electronic microscope photograph showing a surface of a conventional nickel-gold plated layer.
Figure 3:
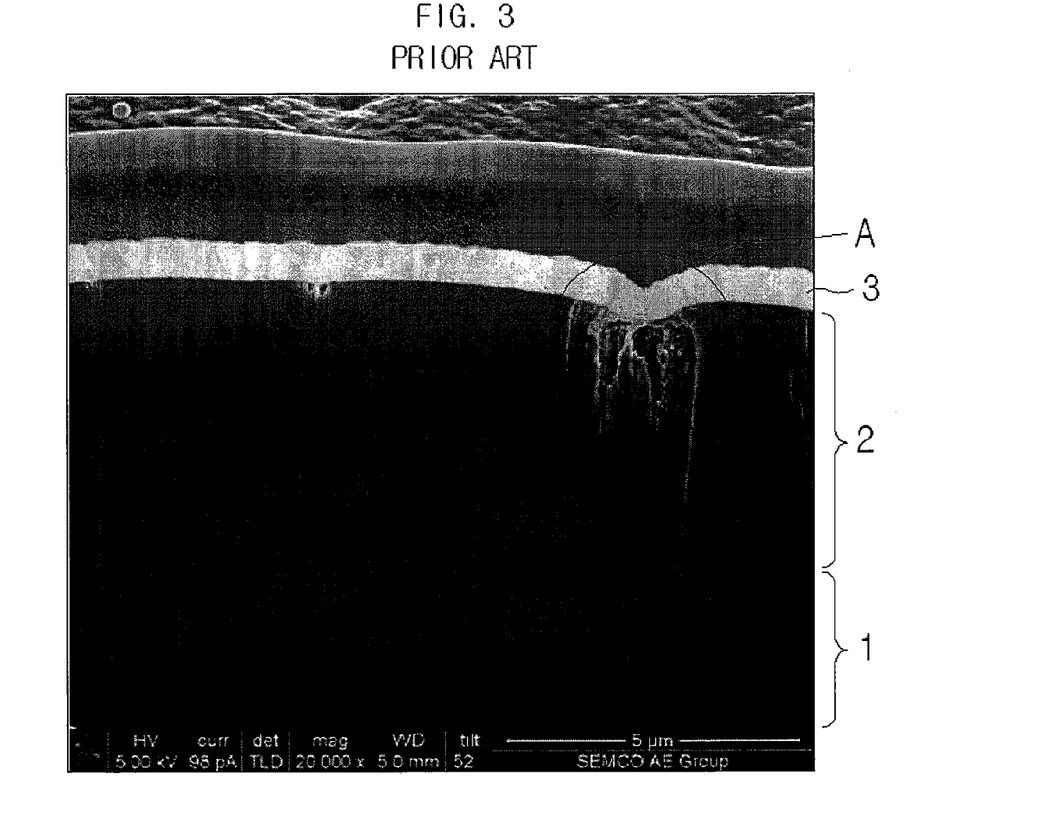
FIG. 3 is an electronic microscope photograph showing a cross section of a conventional nickel-gold plated layer.

FIG. 2 is an electronic microscope photograph showing a surface of a conventional nickel-gold plated layer. FIG. 3 is an electronic microscope photograph showing a cross section of a conventional nickel-gold plated layer. Nickel plating is performed forming a nodule from on the copper. As the nickel plated layer is thicker, the nodule grows. Therefore, the nodule particle has a wider surface area and a larger size. The local substitution is performed along a relatively weak nodule boundary of the nickel plated layer. According to a conventional nickel-gold plating method, since the thick nickel plated layer causes the size of the nodule particle to be larger and the nodule boundary to concentrate on a specified part thereof, corrosion is concentrated on the specified part. Accordingly, as shown in FIGS. 2 and 3, it can be noted that a crack denoted by 'A' is formed on the gold plated layer due to the local excessive substitution.

That is, in order to reduce the crack, a technology for reducing the size of the nodule is required such that the nodule boundary is evenly distributed without concentrating on a specified part thereof. According to an embodiment of the present invention, the nickel plated layer is formed by two stages and the size of the nodule is prevented from being larger, so that the crack in the gold plated layer can be prevented.

Figure 4:
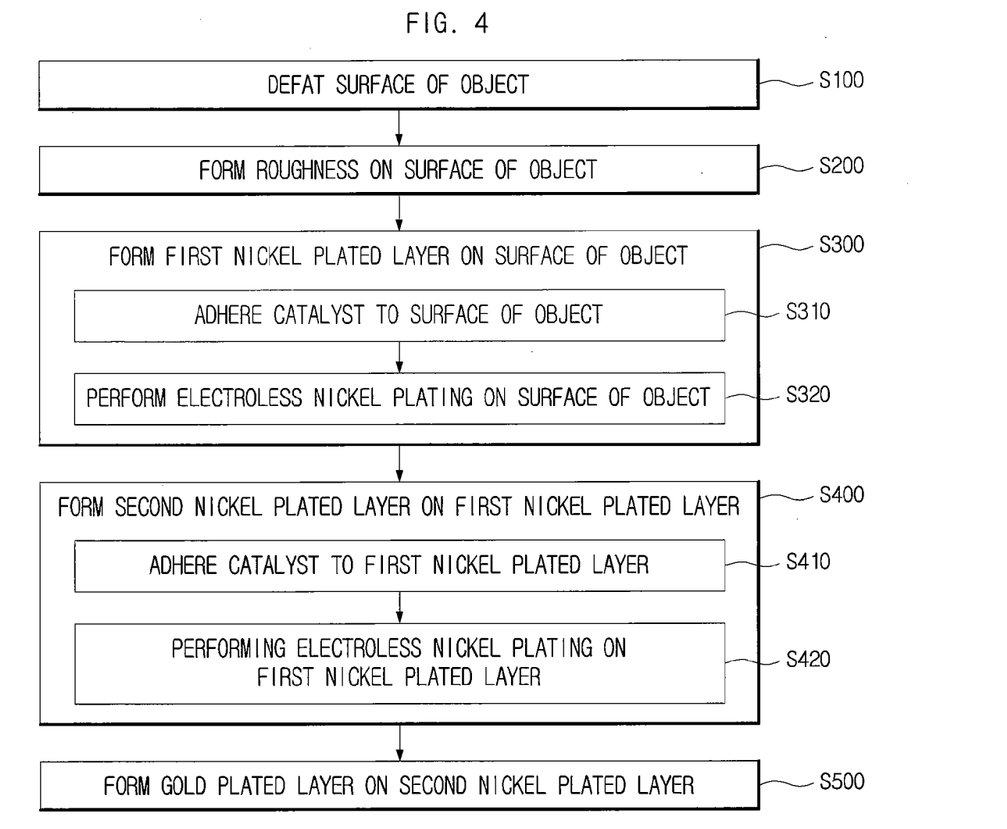
FIG. 4 is a flowchart showing a method of nickel-gold plating in accordance with an aspect of the present invention.

FIG. 4 is a flowchart showing a method of nickel-gold plating in accordance with an aspect of the present invention. FIGS. 5 through 11 are views showing a method of nickel-gold plating in accordance with an aspect of the present invention. In FIGS. 5 through 11, illustrated are an object 10, a contaminant 11, a first palladium layer 15, a first nickel plated layer 20, a second palladium layer 25, a second nickel plated layer 30 and a gold plated layer 40.

Figure 5:
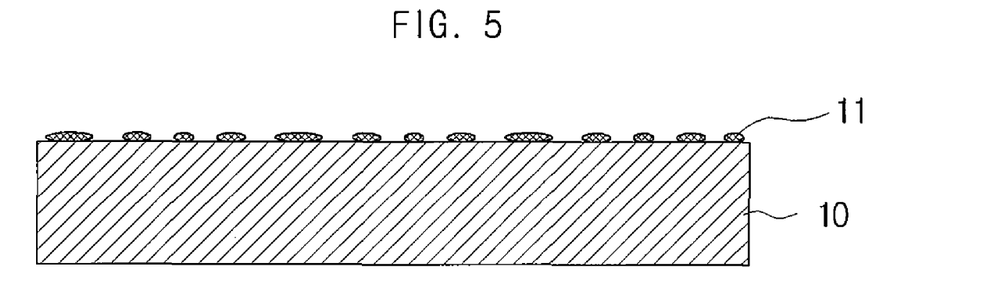
FIGS. 5 through 11 are views showing a method of nickel-gold plating in accordance with an aspect of the present invention.

First, as shown in FIG. 5, the surface of an object 10 can be defatted (S100). Through this process, oil, a fingerprint and dust and the like adhered to the surface of the object 10 are removed and water-absorption is given to the surface of the object. Then, in the next step, the surface of the object 10 is in better contact with an etching solution so that chemical plating can be prevented from mis-adhesion due to air bubbles.

Figure 6:
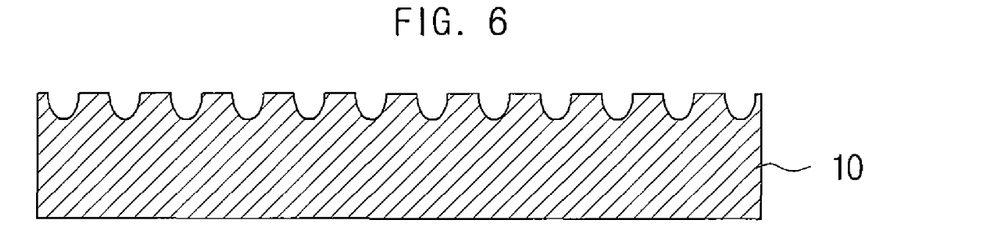

In the next step, as shown in FIG. 6, roughness can be formed on the surface (S200). The surface of the object 10 is appropriately roughened through soft etching, and then suitable adhesion strength and roughness are given to a plating film. If the etching solution remains on the resin surface after the etching, chemical plating can not be completed, and thus the etching solution may be removed.

Next, a first nickel plated layer 20 is formed on the surface of the object 10 (S300).

Figure 7:
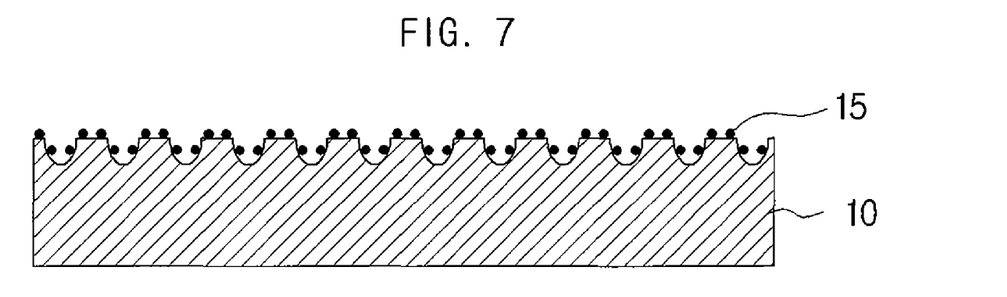
Figure 8:
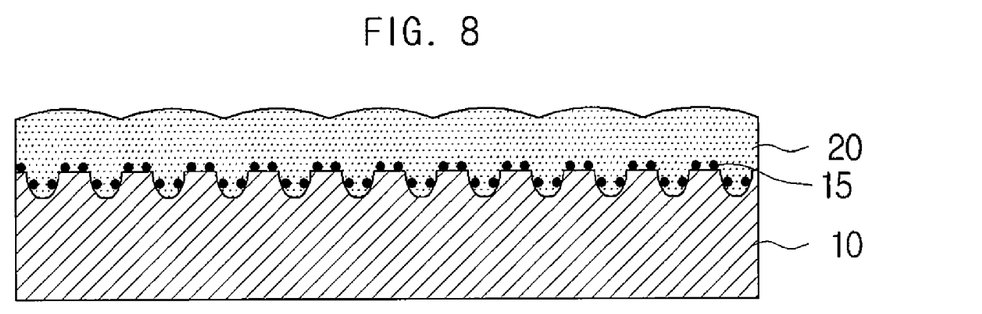

In order to form the first nickel plated layer 20 through electroless nickel plating, a catalyst can be first adhered to the surface of the object 10 as shown in FIG. 7 for the purpose of an effective plating process (S310). This is a process of absorbing a catalytic metal that is a core of the electroless plating on the resin surface. Palladium can be used as a catalyst. Palladium-tin (Pd—Sn) compound is adhered to the surface of the object 10 and tin (Sn) salt is dissolved through an accelerator process. Then, only metallic palladium remains on the surface, and eventually a first palladium layer 15 is formed. Although the first palladium layer 15 can physically cover the entire surface of the object 10, an amount of the first palladium layer that is adequate to function as a catalyst is needed. Accordingly, the first palladium layer 15 may be formed to have palladium metallic particles partly scattered on the surface of the object 10.

After adhering the catalyst, an electroless nickel plating is performed on the surface of the object 10 (S320), and then a first nickel plated layer 20 is formed. The plating is performed by extracting nickel metal onto the surface by using Palladium as a catalyst. The thicker the first nickel plated layer is, the larger the nodule is (see FIG. 8).

Figure 9:
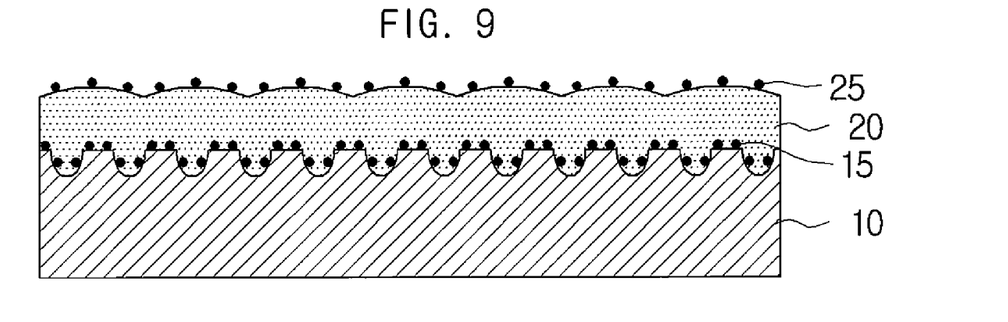
Figure 10:
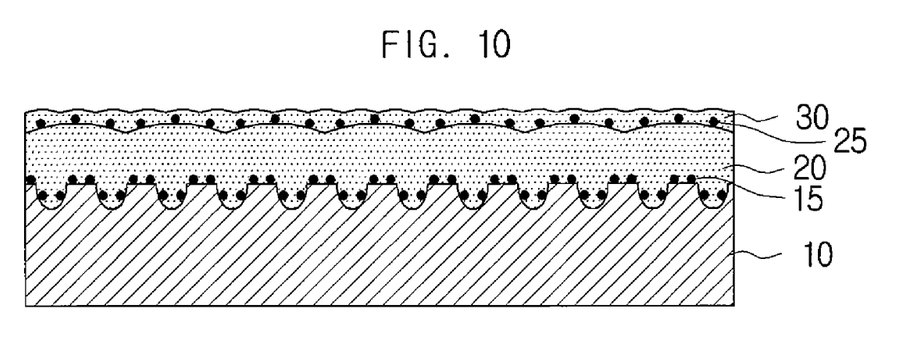

If after forming the first nickel plated layer 20, the gold plating is immediately performed on the first nickel plated layer 20, the large size of the nodule in the first nickel plated layer creates the crack. Accordingly, one nickel plated layer is further formed in the present invention. That is, a second nickel plated layer 30 is formed on the first nickel plated layer 20 (S400). As shown in FIGS. 9 and 10, the second nickel plated layer 30 is formed by adhering the catalyst to the first nickel plated layer 20 (S410) and performing the electroless nickel plating on the first nickel plated layer 20 (S420). These processes are similar to the process of adhering the catalyst on the surface of the object 10 (S310) and the process of performing the electroless nickel plating on the surface of the object 10 (S320) respectively.

A second palladium layer 25 is formed on the first nickel plated layer 20 and new nodule particles are formed again from on the second palladium layer 25. As a result, the nickel plated layer 30 can be formed. It is possible to cause the nodule on the surface of the second nickel plated layer 30 not to greatly grow by forming the second nickel plated layer 30 having a thickness thinner than that of the first nickel plated layer 20.

Figure 11:
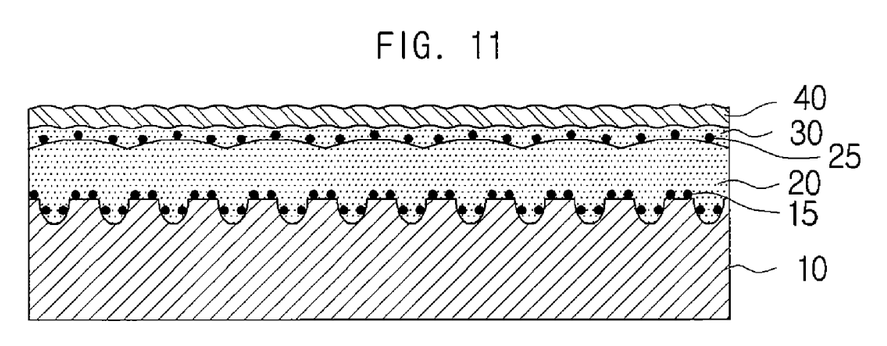
Figure 12:
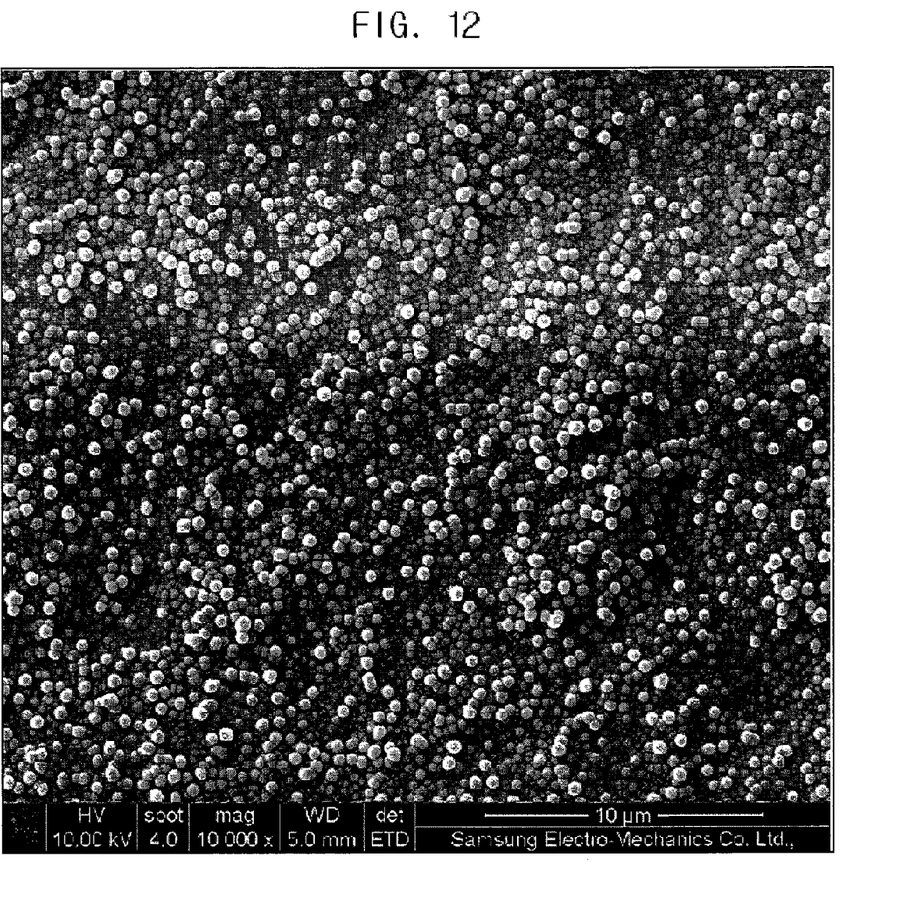
FIG. 12 is an electronic microscope photograph showing a surface of a nickel-gold plated layer formed by a method of nickel-gold plating in accordance with an aspect of the present invention.
Figure 13:
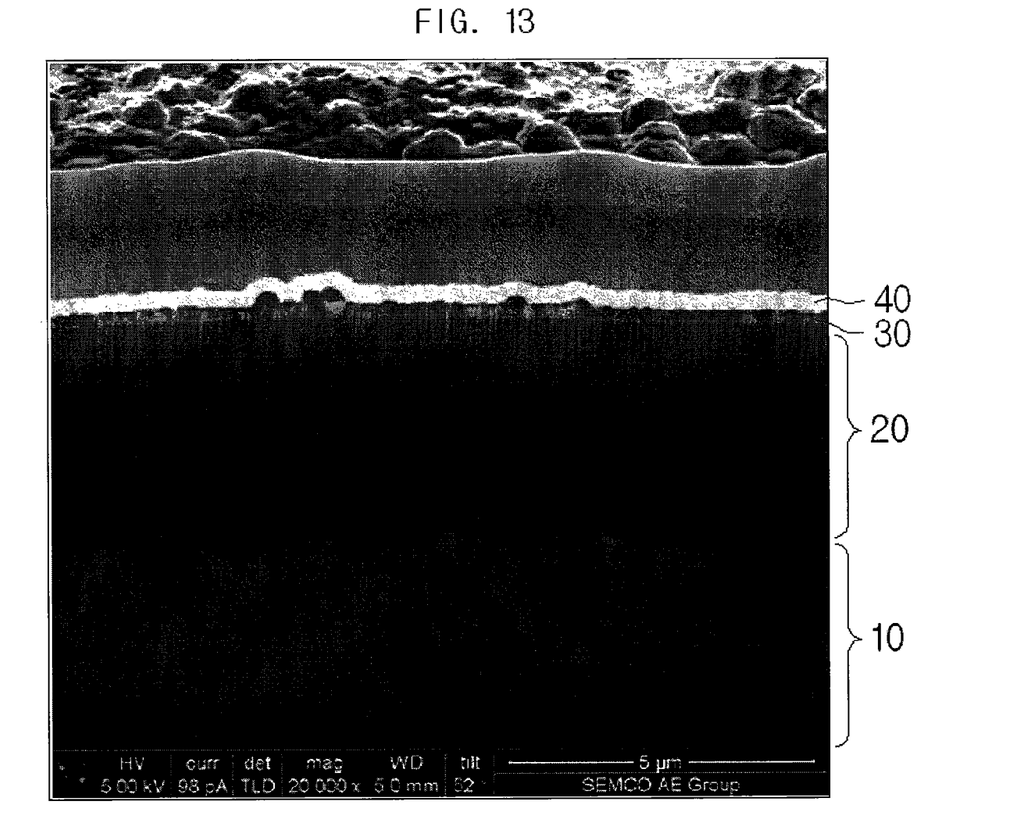
FIG. 13 is an electronic microscope photograph showing a cross section of a nickel-gold plated layer formed by a method of nickel-gold plating in accordance with an aspect of the present invention.

As shown in FIG. 11, a gold plated layer 40 is formed on the second nickel plated layer 30 (S500). The nodule boundary the second nickel plated layer 30 is evenly distributed without concentrating on a specified part thereof, so that the excessive substitution can be prevented. FIG. 12 is an electronic microscope photograph showing a surface of a nickel-gold plated layer formed by a method of nickel-gold plating in accordance with an aspect of the present invention. FIG. 13 is an electronic microscope photograph showing a cross section of a nickel-gold plated layer formed by a method of nickel-gold plating in accordance with an aspect of the present invention. In FIGS. 12 and 13, it can be seen that the gold plated layer 40 is formed to have a uniform shape without cracks.

Figure 14:
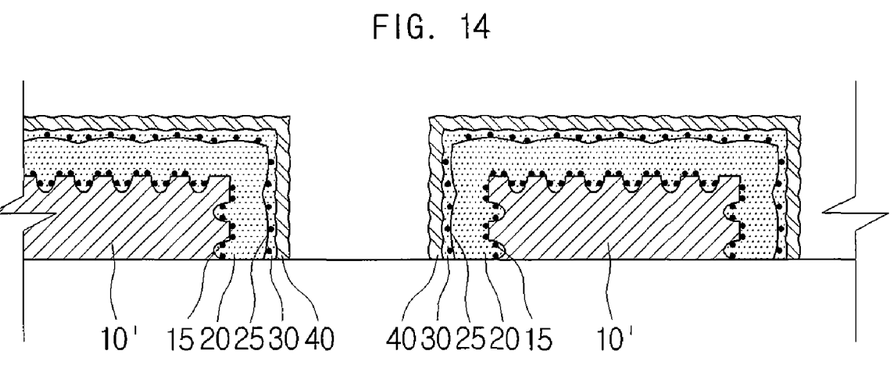
FIG. 14 is a cross sectional view showing a printed circuit board in accordance with another aspect of the present invention.

A printed circuit board according to another aspect of the present invention will be described. FIG. 14 is a cross sectional view showing a printed circuit board in accordance with another aspect of the present invention. Illustrated are a substrate 5, a circuit pattern 10', a first palladium layer 15, a first nickel plated layer 20, a second palladium layer 25, a second nickel plated layer 30 and a gold plated layer 40.

A substrate that is a base for a printed circuit board may be either a mere insulation layer or a layer having a single layer or multiple laminated layers. A circuit pattern formed on the substrate performs a function of transferring an electrical signal, and is made of copper (Cu) having high electrical conductivity.

If gold plating 40 is performed on such a circuit pattern 10', it is possible to improve electrical characteristics, to prevent the corrosion of a chip mounting surface and to obtain bonding characteristics of a semiconductor package manufacturing process.

Because it is difficult to directly perform the gold plating on the circuit pattern 10' and the nickel plated layers 20 and 30 can be used as plating underlayers, a layered structure is obtained, in which the gold plated layer 40 is formed on the nickel plated layers 20 and 30. Meanwhile, the local excessive substitution may be a problem as described above, two nickel plated layers 20 and 30, i.e., the plating underlayers are formed in order to prevent the local excessive substitution in the present invention.

In FIG. 14, illustrated is the second nickel plated layer 30 thinner than the first nickel plated layer 20. The second nickel plated layer 30 is formed on the first nickel plated layer 20. The first nickel plated layer 20 is formed on the circuit pattern 10'. In order to describe the layered structure of the plated layer, the thickness of the plated layer is exaggerated as compared with the thickness of the plated layer to be actually formed. Since the second nickel plated layer 30 is thinner than the first nickel plated layer 20 and the nodule of the second nickel plated layer 30 grows slightly and stops, the gold plated layer 40 can be formed without cracks, that is, local corrosion on the second nickel plated layer 30, as shown in FIG. 12.

A first palladium layer 15 can be interposed between the circuit pattern 10' and the first nickel plated layer 20. A second palladium layer 25 can be interposed between the first nickel plated layer 20 and the second nickel plated layer 30.

The first palladium layer 15 and the second palladium layer 25 are catalyst layers for forming the first nickel plated layer 20 and the second nickel plated layer 30. Since the thickness that physically separates the layers may be smaller as long as it is thick enough to function as a catalyst, the first palladium layer 15 and the second palladium layer 25 may be shaped that palladium metal particles are partly adhered to the circuit pattern or the first nickel plated layer 20.

While the present invention has been described with reference to an embodiment thereof, it will be understood by those skilled in the art that various changes and modification in forms and details may be made without departing from the spirit and scope of the present invention as defined by the appended claims.

Numerous embodiments other than embodiments described above are included within the scope of the present invention.

What is claimed is:

1. A method of electroless nickel-gold plating an object, the method comprising:
    forming a first nickel plated layer on a surface of the object;
    forming a second nickel plated layer on the first nickel plated layer, the second nickel plated layer being electroless nickel plated to be thinner than the first nickel plated layer and formed with nodules that are smaller than a surface of the first nickel plated layer; and
    forming a gold plated layer on the second nickel plated layer.

2. The method of claim 1, wherein the forming of the first nickel plated layer comprises:
    adhering a catalyst to the object; and
    performing electroless nickel plating on the object.

3. The method of claim 2, wherein the catalyst comprises palladium (Pd).

4. The method of claim 1, wherein the forming of the second nickel plated layer comprises:
    adhering a catalyst to the first nickel plated layer; and
    performing electroless nickel plating on the first nickel plated layer.

5. The method of claim 4, wherein the catalyst comprises palladium (Pd).

6. The method of claim 1, further comprising, before the forming of the first nickel plated layer, forming roughness on the surface of the object.

7. A printed circuit board comprising:
    a substrate;
    a circuit pattern formed on a surface of the substrate;
    a first nickel plated layer formed on the circuit pattern;
    a second nickel plated layer formed on the first nickel plated layer, the second nickel plated layer being formed to be thinner than the first nickel plated layer by electroless plating and formed with nodules that are smaller than a surface of the first nickel plated layer; and
    a gold plated layer formed on the second nickel plated layer.

8. The printed circuit board of claim 7, wherein a first palladium layer is interposed between the circuit pattern and the first nickel plated layer.

9. The printed circuit board of claim 7, wherein a second palladium layer is interposed between the first nickel plated layer and the second nickel plated layer.

* * * * *